US006959272B2

(12) United States Patent
Wohl et al.

(10) Patent No.: US 6,959,272 B2
(45) Date of Patent: Oct. 25, 2005

(54) METHOD AND SYSTEM FOR GENERATING AN ATPG MODEL OF A MEMORY FROM BEHAVIORAL DESCRIPTIONS

(75) Inventors: Peter Wohl, Williston, VT (US); John Waicukauski, Tualatin, OR (US); Timothy G. Hunkler, Mesa, AZ (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/360,069

(22) Filed: Jul. 23, 1999

(65) Prior Publication Data

US 2004/0167764 A1 Aug. 26, 2004

(51) Int. Cl.[7] ................................. G06F 13/10

(52) U.S. Cl. .................... 703/20; 711/104; 717/109

(58) Field of Search ............................. 703/20, 14, 15; 711/104, 102, 108; 717/109; 395/50

(56) References Cited

U.S. PATENT DOCUMENTS

| | | | | |
|---|---|---|---|---|
| 5,508,641 A | * | 4/1996 | Appenzeller et al. ........ | 326/113 |
| 5,668,492 A | * | 9/1997 | Pedersen et al. ............ | 327/291 |
| 5,696,771 A | * | 12/1997 | Beausang et al. ........... | 714/726 |
| 5,796,990 A | * | 8/1998 | Erle et al. ................... | 716/4 |
| 5,864,704 A | * | 1/1999 | Battle et al. ................ | 712/24 |
| 6,148,436 A | * | 11/2000 | Wohl .......................... | 716/18 |
| 6,212,669 B1 | * | 4/2001 | Jain ............................ | 716/7 |

OTHER PUBLICATIONS

"Testing "untestable" faults in three-state circuits" by Wohl et al, 0-8-86-7304-Apr. 1996, IEEE pp. 324-333.*

"The Computer Science and Engineering Handbook", by Allen B. Tucker, CRC Press ISBN: 0-8493-2909-4, 1996, pp. 450-453.*

"HDL Chip Design" by Douglas J. Smith, 1996, Ninth printing 2001 minor updates, ISBN 0-9651934-3-8, pp. 38-40.*

(Continued)

*Primary Examiner*—Kevin J. Teska
*Assistant Examiner*—Ed Garcia-Otero
(74) *Attorney, Agent, or Firm*—Bever, Hoffman & Harms LLP; Jeanette S. Harms

(57) ABSTRACT

A method and system for constructing a structural model of a memory for use in ATPG (Automatic Test Pattern Generation). According to an embodiment of the present invention, behavioral models of memories of the simulation libraries are re-coded into simplified behavioral models using behavioral hardware description language (e.g., Verilog). Then, the simplified behavioral models are automatically converted into structural models that include ATPG memory primitives. The structural models are then stored for subsequent access during pattern generation. In one embodiment, for modeling random access memories (RAMs), the ATPG memory primitives include memory primitives, data bus primitives, address bus primitives, read-port primitives and macro output primitives. In another embodiment, for modeling content addressable memories (CAMs), the ATPG memory primitives include memory primitives, compare port primitives and macro output primitives. An advantage of the present invention is that functional equivalence between the simplified behavioral models and the simulation models can be easily verified with the same behavioral hardware description language simulator (e.g., Verilog simulator). Another advantage of the present invention is that very complicated memories, such as CAMs, can be accurately modeled for ATPG.

17 Claims, 22 Drawing Sheets

OTHER PUBLICATIONS

CRC Handbook of Mathematical Science, 5th Edition, William H. Beyer, CRC Press, Inc.,Fourth Printing, 1985, ISBN 0–8493–0655–8, p. 47.*

Tutorial and Survey Paper: Gate–Level Test Generation for Sequential Circuits by Kwang–Ting Cheng, ACM Transactions on Design Automation of Electronic Systems, vol. 1, No. 4, Oct. 1996, pp. 405–442.*

"Using Verilog simulation libraries for ATPG", Wohl et al, Test Conference, 1999. Proceedings, International, 1999 pp. 1011–1020.*

"Defining ATPG rules checking in STIL", Wohl et al, Test Conference, 1998. Proceedings., International, 1998 pp. 971–979.*

"Using ATPG for clock rules checking in complex scan designs", Wohl et al, VLSI Test Symposium, 1997., 15th IEEE, 1997 pp. 130–136.*

"Test generation for ultra–large circuits using ATPG constraints and test pattern templates", Wohl et al, Test Conference, 1996. Proceeedings., International, 1996.*

* cited by examiner

```
memory_port ::= read_port | write_port | set_port | reset_port
read_port ::= always @ ( level_read_port | edge_read_port )
write_port ::= always @ ( level_write_port | edge_write_port )
reset_port ::= [begin] sr_control memory_name [address_net] <= 0_constant; [signal]
set_port ::= [begin] sr_control memory_name [address_net] <= 1_constant; [signal]
level_read_port ::= [ ( ] address_net [or control_net] [or event] [)]
    (net_control | addr_control) read_port_assign [ else reg_net <= constant ; ]
level_write_port ::= ( address_net or control_net or data_net )
    net_control write_port_assign
edge_read_port ::= (edge clock_net) (net_control | addr_control) read_port_assign
edge_write_port ::= (edge clock_net) [net_control] write_port_assign
read_port_assign ::= reg_net <= memory_name [ address_net ] ;
write_port_assign ::= [begin] memory_name [ address_net ] <= data_net ; [signal]
sr_control ::= always @ control_net net_control
    for ( index = 0 ; index < max_address; index = index + 1 )
net_control ::= if ( [!] control_net )
addr_control ::= if ( address_net <= max_address )
signal ::= #0; -> event ; end
constant ::= number_bits ' base { digit }+
edge ::= posedge | negedge
base ::= b | B | h | H
digit ::= 0|1|2|3|4|5|6|7|8|9|0|a|A|b|B|c|C|d|D|e|E|f|F|x|X|z|Z
```

```
`celldefine
`ifdef verifault
    `suppress_faults
    `enable_portfaults
`endif
module ROM ( ... );
output ...; input ...; wire ...;
reg [3:0] _doutr;
reg [3:0] rom_data [ 0:127 ];
    // control circuit
    buf ( _H15, H15 );
    ....
    //data out
    buf ( N01,_dout [0] );
    ....
    //address
    buf ( _H07, H07 );
    buf ( _H14; H14 );
    and ( _a [6], _H07, _H15 );
    and ( _ta [6], _H14, _TEB );
    or ( _ad [6], _a [6], _ta [6] );
initial
        $readmemh ("file" , rom_data );
always @ _ad // read port
        if ( _ad   <= 127 )
            _doutr = rom_data [_ad];
        else
            _doutr = 4'bx;
specify
...
endspecify
endmodule
`ifdef verifault
    `nosupress_faults
    `disable_portfaults
`endif
`endcelldefine
```

FIGURE 5
(CONVENTIONAL ART)

```
module atpgram ( r,w, a, d1, d2 );
input r,w;
input [127:0] a;
input [7:0] d1;
output [7:0] d2;
    reg [7:0]  mymem [15:0],  d2;
    integer i;
function [6:0] addr_encode;
input [127:0] addr;  // decoded address
integer n;
begin
    addr_encode = 7'bx;  // init
    for (n=0; n < 128; n=n+1) begin
        if (addr [n] ==1) begin
            addr [n] =0;
            if ( I addr == 0) addr_encode=n;
            n = 128;  // break
        end
    end
end
endfunction always @ (posedge w) if (a)
                mymem [addr_encode (a) ] = d1;
    always @ r if (r && a)
                d2 = mymem [addr_encode (a) ];
endmodule
```

FIGURE 8

```
input [7:0] comp;
output [3:0] addr;
output hit, mhit;
hit = 0; mhit = 0;
addr = 4'bX;
for (i=0;   i<16;   i=i+1) begin
    if (mymem[I] ==comp) begin
        if (hit==1) mhit = 1;
        hit = 1;
        addr = i; // keep last address
    end
end
```

```
input [7:0] comp, mask;
output [3:0] addr;
output hit, mhit;
hit = 0; mhit = 0;
addr = 4' bX;
for (i=0; i<16; i=i+1) begin
 if ( (mymem[i] &mask) ==(comp&mask) )
  begin
    if (hit==1) mhit = 1;
    else addr - i; // keep 1st address
    hit = 1;
  end
end
```

```
input [7:0] comp, mask;
output [15:0] addr;
output hit, mhit;
hit = 0; mhit = 0;
addr = 0;
for (i=0; i<16; i=i+1) begin
    if ( (mymem[i] &mask) ==(comp&mask) )
        begin
            if (hit==1) begin
                hit = 0;
                i = 16; // break;
            end
            else addr [i] = 1; // keep 1st addr
            hit = 1;
        end
end
```

```
module withram (reset, r,w, a, d1,d2);
input reset, r,w;
input [3:0] a;
input [7:0] d1;
output [7:0] d2;
    reg [7:0] mymem [15:0], d2;
    integer i;
    event mymem_update;
    always @ reset if (reset) begin
    for (i=0; i<16; i=i+1) mymem [i] <=0;
    #0; ->mymem_update; end
    always @ (posedge w) begin
    mymem [a] <= d1; #0; ->mymem_update;
    end
    always @ (r or a or mymem_update)
    if (r) d2 <= mymem [a];
    else d2 <= 8'b0;
endmodule                                    1200
```

FIGURE 12

METHOD AND SYSTEM FOR GENERATING AN ATPG MODEL OF A MEMORY FROM BEHAVIORAL DESCRIPTIONS

BACKGROUND OF THE INVENTION

1. Field of the Invention

The present invention relates to the field of electronic design automation (EDA). More specifically, the present invention relates to techniques for producing gate-level and structural descriptions used in a computer controlled EDA system for integrated circuit (IC) design.

2. Related Art

The rapid growth of the complexity of modern electronic circuits has forced electronic circuit designers to rely upon computer programs to assist and automate most steps of the circuit design process. Typical circuits today contain hundreds of thousands or millions of individual pieces or "cells." Such a design is much too large for a circuit designer or even an engineering team of designers to manage effectively manually. To automate the circuit design and fabrication of integrated circuit devices, electronic design automation (EDA) systems have been developed.

An EDA system is a computer software system designers use for designing integrated circuit (IC) devices. The EDA system typically receives one or more high level behavioral descriptions of an IC device (e.g., in HDL languages like VHDL, Verilog, etc.) and translates this behavioral description into netlists of various levels of abstraction. At a higher level of abstraction, a generic netlist is typically produced based on technology independent primitives. A netlist describes the IC design and is composed of nodes (elements) and edges, e.g., connections between nodes, and can be represented using a directed cyclic graph structure having nodes which are connected to each other with signal lines. The netlist description is typically stored in computer readable media within the EDA system and processed and verified using many well known techniques. The EDA system ultimately produces a physical device layout in mask form which can be used to directly implement structures in silicon to realize the physical IC device.

FIG. 1 illustrates a portion of a typical design flow 10 for the design of integrated circuits (e.g., ASIC, microprocessors, microcontrollers, etc.). As shown, design flow 10 includes a simulation library 11, also known as the "golden" library or the "sign-off" library, which contains descriptions of the design cells, and upon which the downstream IC design is based. A significant amount of effort is expended into creating, verifying, refining and correcting the simulation library 11. The simulation library 11, containing a large number of cell descriptions written in a behavioral hardware description language (HDL), can only be read by behavioral simulation tools (e.g., Verilog simulator). Therefore, after the simulation library 11 is created designers create a separate test library 12 that mirrors the simulation library 11 to support rules checking and automatic test pattern generation (ATPG). Test library 12 typically includes ATPG models for use by ATPG tools 19.

One drawback of the prior art approach is that a manual re-coding process 15 must be performed by the designers to translate the simulation library 11 into the test library 12. For instance, simulation models of memories must be completely re-written into ATPG models. Significant "simulation-only" functionality must be identified and removed, while other "ATPG-only" functionality may need to be added. The manual re-coding process 15 is complicated and requires a high level of skill and knowledge in both behavioral modeling and ATPG modeling. Certain complex designs, such as content addressable memory (CAM), may be too overwhelming for manual re-coding process 15.

Another drawback of the prior art approach is that human error may be introduced in the manual re-coding process 15. Thus, an equivalence verification process 14 for verifying functional equivalence between the simulation models and the manually re-coded ATPG models is needed. Simulation models of the simulation library 11, however, can be simulated only by a behavioral HDL simulator (e.g., Verilog simulator), whereas the ATPG models in the test library 12 can be simulated only by ATPG tools. Therefore, the equivalence verification process 14 is a very complicated task.

Yet another drawback of the prior art approach is that, from a user's perspective, ATPG models are very different from behavioral models. Therefore, ATPG reports 20 generated by ATPG tools 19 may be unfamiliar to the users used to model 11. This makes the process of debugging ATPG models even more difficult.

Therefore, what is needed is a method and system for converting simulation models of memories into ATPG models without requiring a significant amount of re-coding. What is yet further needed is a method and system for minimizing verification between the simulation models and the ATPG models. What is yet further needed is a method and system for facilitating users in debugging errors of the ATPG models. In view of the above needs, the present invention provides a system and method for automatically generating ATPG models for memories from behavioral descriptions. These and other advantages of the present invention not specifically mentioned above will become clear within discussions of the present invention presented herein.

SUMMARY OF THE DISCLOSURE

The present invention provides a method and system for generating TPG models for memories based on behavioral memory models. The present invention does not require re-coding for most ROMs (Read-Only Memories), and requires simple re-coding for RAMs (Random Access Memories) and CAMs (Content Addressable Memories). The present invention automatically constructs structural ATPG memory models of memories directly from behavioral descriptions (or behavioral models). Thus, the tedious, time-consuming, error-prone and difficult tasks of manually re-coding ATPG models for memories and verifying functional equivalence between simulation models and ATPG models are eliminated.

In one embodiment, the present invention includes an ATPG memory model generation process that is capable of directly converting behavioral descriptions of ROMs stored within simulation libraries into ATPG models. Complicated RAMs and CAMs are re-described as simplified behavioral descriptions (or simplified behavioral models) using a pre-defined subset of behavioral Verilog. The ATPG memory model generation process of the present embodiment, which recognizes the pre-defined subset of behavioral Verilog, directly reads in the simplified behavioral models, and generates ATPG models therefrom.

In furtherance of an embodiment of the present invention, an ATPG model for a memory includes a set of ATPG memory primitives that are defined to closely represent the simulation model of the memory. Particularly, an ATPG model for RAM includes a memory primitive, an address bus primitive, a data bus primitive, a read port primitive and macro output primitives. An ATPG model for CAM includes a memory primitive, a compare port primitive and macro output primitives. An ATPG model for a CAM-RAM includes two memory primitives, an address bus primitive, a data bus primitive, a read port primitive and macro output primitives. According to one embodiment of the present invention, the memory primitive is for storing the memory values for the memories; the address bus primitive is for calculating address values for the memory primitive and the read-port primitive; the databus primitive is for determining data values for the memory primitive; and the read port is for connecting an output of the memory primitive to multiple MOUT primitives which hold the simulated values; and the compare port primitive is for matching data from a data bus primitive to the content of a memory primitive and for outputting the address of the memory primitive containing the data.

The present invention also provides a schematic viewer for graphically displaying the ATPG memory primitives and their interconnections in an organization that resembles the simulation model. By displaying the ATPG memory primitives and their interconnections in such a manner, the ATPG model debugging process is facilitated, and debugging reports can be correlated with the displayed graphical model.

Embodiments of the present invention include the above and further include a computer readable medium having computer-readable program code embodied therein for causing a computer system to perform a method of constructing an ATPG model for a memory, the method comprising the steps of: (a) accessing a simplified behavioral model of the memory wherein the simplified behavioral model is described in a behavioral hardware description language and wherein the simplified behavioral model is generated based on a simulation model of the memory; and (b) automatically translating the simplified behavioral model into the ATPG model comprising a plurality of ATPG memory primitives.

BRIEF DESCRIPTION OF THE DRAWINGS

The accompanying drawings, which are incorporated in and form a part of this specification, illustrate embodiments of the present invention and, together with the description, serve to explain the principles of the invention.

FIG. 4 is a simplified formal description of a memory port using an exemplary subset of Verilog in accordance with one embodiment of the present invention.

FIG. 5 shows portions of an exemplary simulation model of a ROM contained in simulation library in accordance with the present invention.

FIG. 8 illustrates a simplified behavioral model of an exemplary RAM that includes an explicit encoding function in accordance with an embodiment of the present invention.

FIG. 9A illustrates a simplified behavioral model of an exemplary CAM according to an embodiment of the present invention.

FIG. 9B illustrates a simplified behavioral model of another exemplary CAM according to an embodiment of the present invention.

FIG. 9C shows a simplified behavioral model of yet another CAM according to an embodiment of the present invention.

FIG. 12 illustrates an exemplary modified behavioral description according to one embodiment of the present invention.

DETAILED DESCRIPTION OF THE INVENTION

Figure 1:
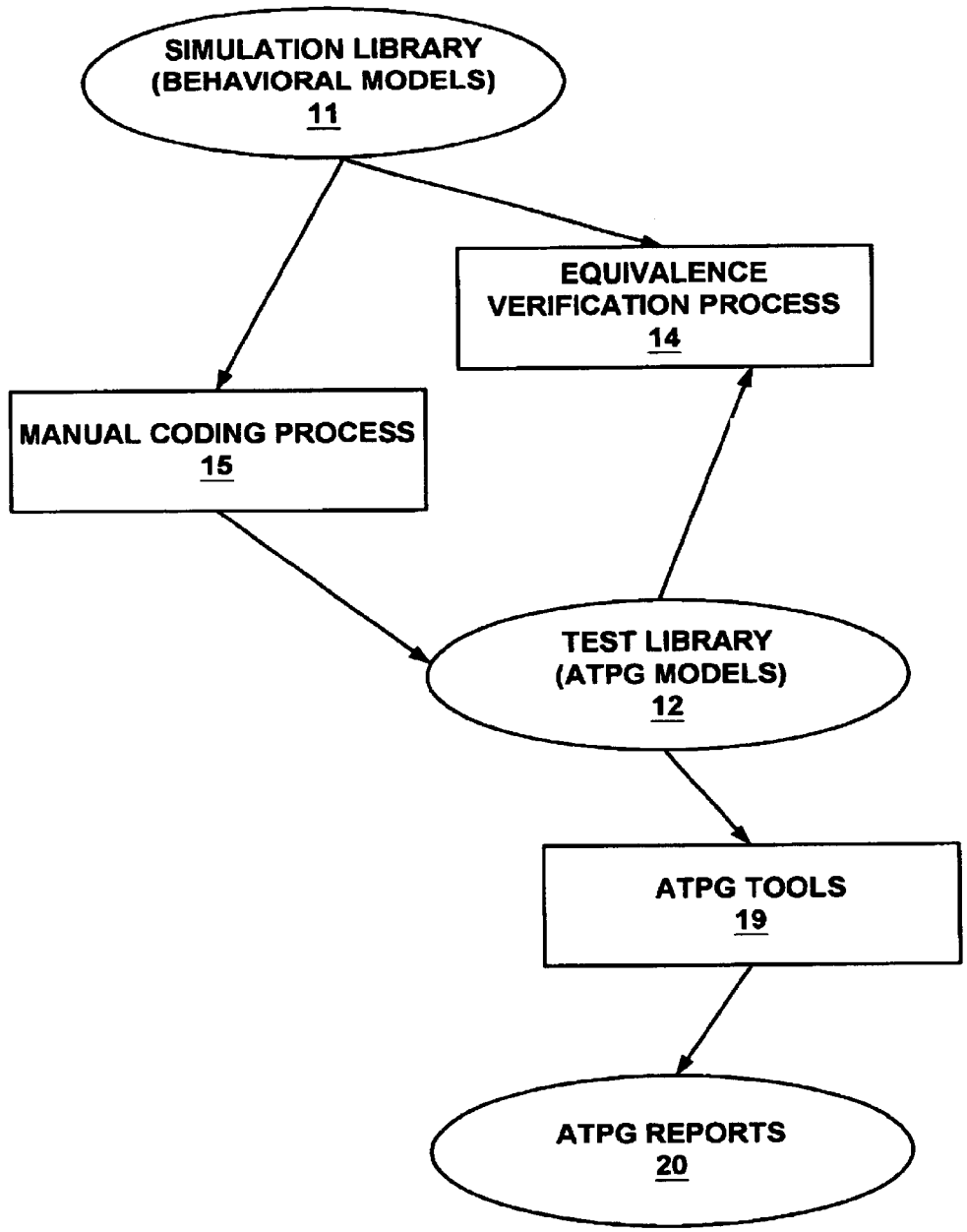
FIG. 1 illustrates a typical prior art integrated circuit (IC) design flow including a manual re-coding step for memories and an equivalence verification step.

In the following detailed description of the present invention, a system and method for automatic generation of gate-level descriptions from table-based descriptions within the field of electronic design automation, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "displaying" or "recognizing" or the like, refer to the action and processes of a computer system (e.g., FIG. 2), or similar electronic computing device, that manipulates and transforms data represented as physical (electronic) quantities within the computer system's registers and memories into other data similarly represented as physical quantities within the computer system memories or registers or other such information storage, transmission or display devices.

Computer System Platform 112

Aspects of the present invention, described below, are discussed in terms of steps executed on a computer system. These steps are implemented as program code stored in computer readable memory units of a computer system and are executed by the processor of the computer system. Although a variety of different computer systems can be used with the present invention, an exemplary general purpose computer system 112 is shown in FIG. 2.

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are computer readable memories. Memory units of system 112 include 102, 103 and 104.

Figure 2:
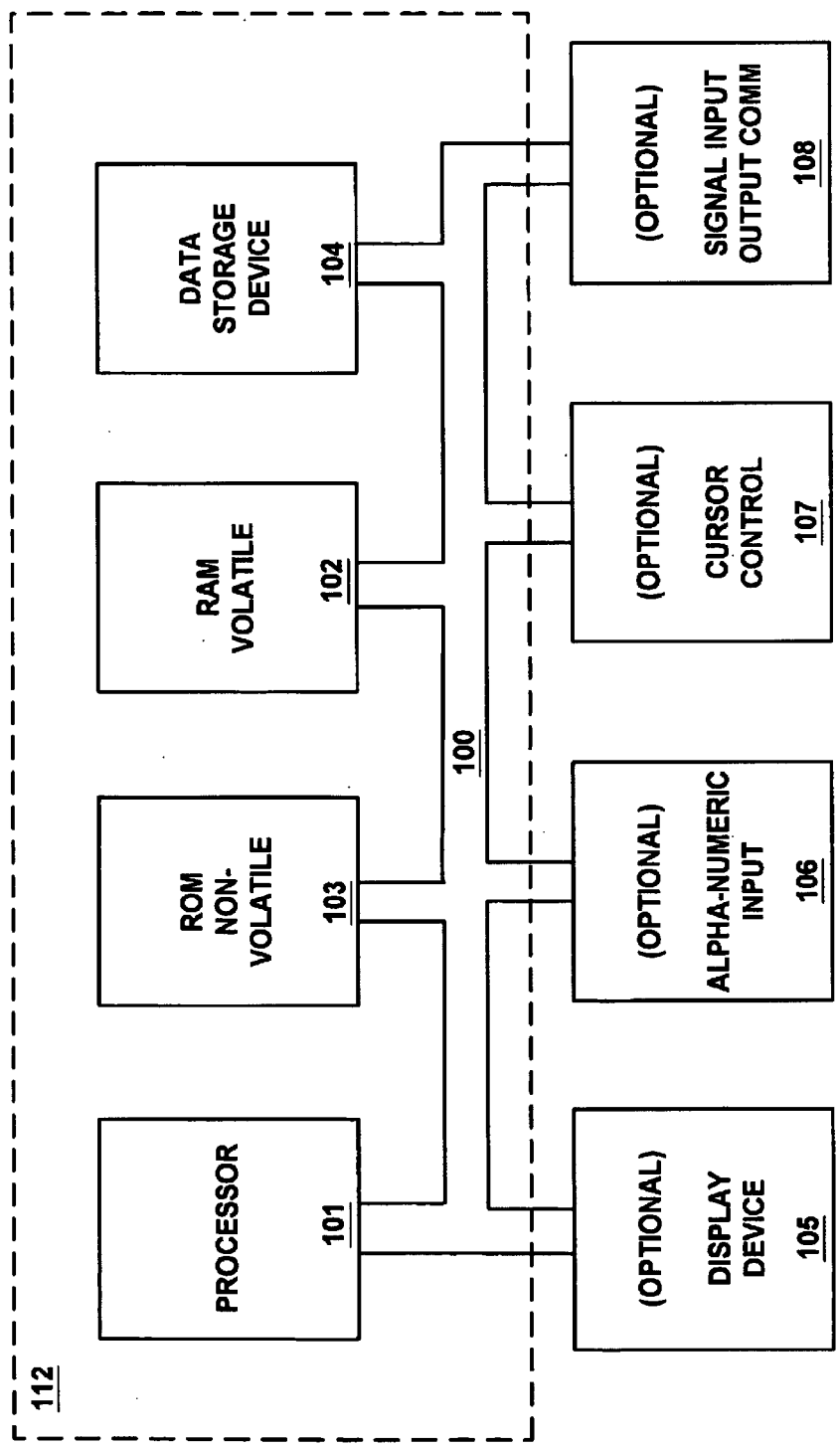
FIG. 2 is a general purpose computer system which provides an operational platform for embodiments of the present invention.

Also included in computer system 112 of FIG. 2 is an alphanumeric input device 106 including alphanumeric and function keys coupled to the bus 100 for communicating information and command selections to the central processor 101. Computer system 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

Figure 3:
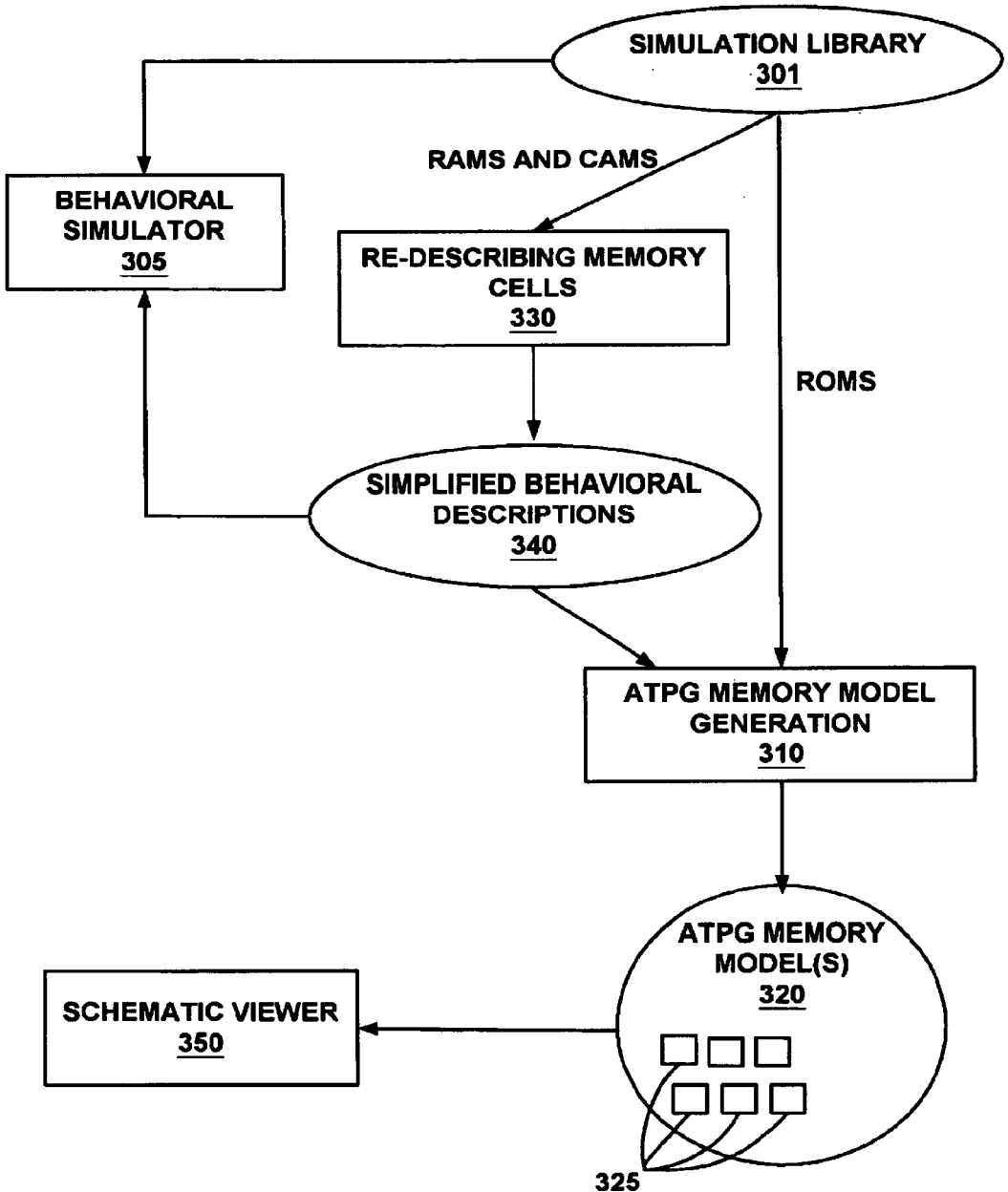
FIG. 3 illustrates an IC design flow in accordance with an embodiment of the present invention where behavioral models of the memories of the simulation library are automatically translated into ATPG models.

Process of Constructing ATPG Models of Memories for Automatic Test Pattern Generation In Accordance with the Present Invention FIG. 3 illustrates an IC design flow 300 in accordance with the present invention. Design flow 300 begins with simulation library 301, or "golden" library, that contains behavioral description of various cell types including memories. According to the present invention, behavioral descriptions of Read-Only Memories (ROMs) are read directly by ATPG memory model generation process 310 for generating ATPG memory models (e.g., structural models) 320. Behavioral descriptions of other types of memories, such as random access memories (RAMs) and content addressable memories (CAM), are re-written as simplified behavioral descriptions (simplified behavioral models) 340 by re-description process 330. According to one embodiment of the present invention, the simplified behavioral descriptions 340 are written in a predefined subset of a behavioral hardware description language (e.g. behavioral Verilog) and do not include non-ATPG related information such as timing and physical layout information. The simplified behavioral descriptions 340 may then be automatically converted into ATPG memory models 320 by ATPG memory model generation process 310. Significantly, in the present invention, the ATPG memory models 320 contain ATPG memory primitives 325.

It is appreciated that the test library 12 and the test library re-coding process 15 of the prior art (FIG. 1) are eliminated in the IC design flow 300 of the present invention. Most cells of the simulation library 301, including ROMs, can be automatically converted into ATPG memory models 320 by the ATPG memory model generation process 310 of the present invention. Only complicated memories, such as RAMs and CAMs, may need be simplified before the ATPG memory model generation process 310 can automatically convert them into ATPG memory models 320. It should also be appreciated that the equivalence verification process 14 (FIG. 1) is also eliminated. In the present invention, behavioral descriptions of ROMs contained in simulation library 301 are used directly by ATPG memory model generation process 310, whereas the simplified behavioral descriptions 340 of the RAM and CAMs can be verified against the simulation models contained within the simulation library 301 by using a commercially available behavioral simulator (e.g., a Verilog simulator) 305.

The present invention also provides a schematic viewer 350 for displaying schematic representations of ATPG models 320 to the users. By viewing the primitives 325 and their interconnections with the schematic viewer 350, the designers would be able to readily determine whether the ATPG model generation process 310 has accurately generated ATPG memory models 320 for the behavioral descriptions 600 and the simulation library 301. In addition, the error codes and ATPG reports generated by ATPG tools closely correspond to the primitives 325 of the ATPG models 320. In this way, the process of debugging of the ATPG memory models 320 is significantly simplified.

Automatic generation of structural descriptions from table-based descriptions is described in U.S. Pat. No. 6,148,436, issued on Nov. 14, 2000, entitled "Automatic Generation of Gate-Level Descriptions from Table-Based Descriptions for Electronic Design Automation," by Peter Wohl, assigned to the assignee of the present invention, and is incorporated herein by reference.

According to one embodiment of the present invention, simulation models of memories can be re-described as simplified behavioral models 340 using a predefined subset of behavioral Verilog. FIG. 4 illustrates simplified formal description 400 of a memory port using an exemplary subset of behavioral Verilog.

Behavioral Modeling of Read-Only Memories in Accordance with the Present Invention According to the present invention, ROMs generally do not need to be re-described because the behavioral descriptions for ROMs are generally not complex. Thus, ATPG memory model generation process 310 can directly read behavioral descriptions (or, behavioral models) from simulation library 301 and then build an internal model based on ATPG memory primitives 325.

FIG. 5 shows portions of the behavioral description 500 of an exemplary ROM contained in simulation library 301. For brevity, most surrounding gates are removed. According to the present invention, the simulation model 500 is read "as-is" by the ATPG memory model generation process 310. In accordance with the present invention, the main components that need be extracted from the behavioral description 500 are: library cell identification (e.g., 'celldefine, 'endcelldefine); fault control statements (e.g., 'suppress_ faults, 'enable_portfaults, 'nosuppress faults, 'disable_ portfaults, etc.); definitions of ports and internal nets, state element definitions (e.g., reg [3:0] rom_data [0:127], reg [3.0] _doutr, etc.); a network of simple primitives (e.g., buffers, AND gates, OR gates, etc.) that surround the memory core on data and address lines; a memory initialization from file construct ($read-memh or $readmemb); and read port definitions (always @ . . . ). The ATPG memory model generation process 310 (FIG. 3) of the present invention automatically extracts these main components from the simulation model 500, and constructs an ATPG memory model that includes ATPG memory primitives 325. An exemplary set of ATPG memory primitives on which an ATPG memory model can be based is discussed in greater detail below.

Behavioral Modeling of Random-Access Memories in Accordance with the Present Invention Simulation models of RAMs are very complex, often having thousands of lines of behavioral Verilog that are organized based on the timing and layout of the RAM. In most cases, it is very difficult to extract a unit-delay or zero-delay functional model from the behavioral description of a RAM. Accordingly, in the present invention, behavioral descriptions of complicated memories are simplified by re-describing the memories with a predefined subset of behavioral Verilog. The simplified behavioral descriptions (or behavioral models) can then be automatically converted into ATPG memory models by process 310 in accordance with the present invention.

Figure 6A:
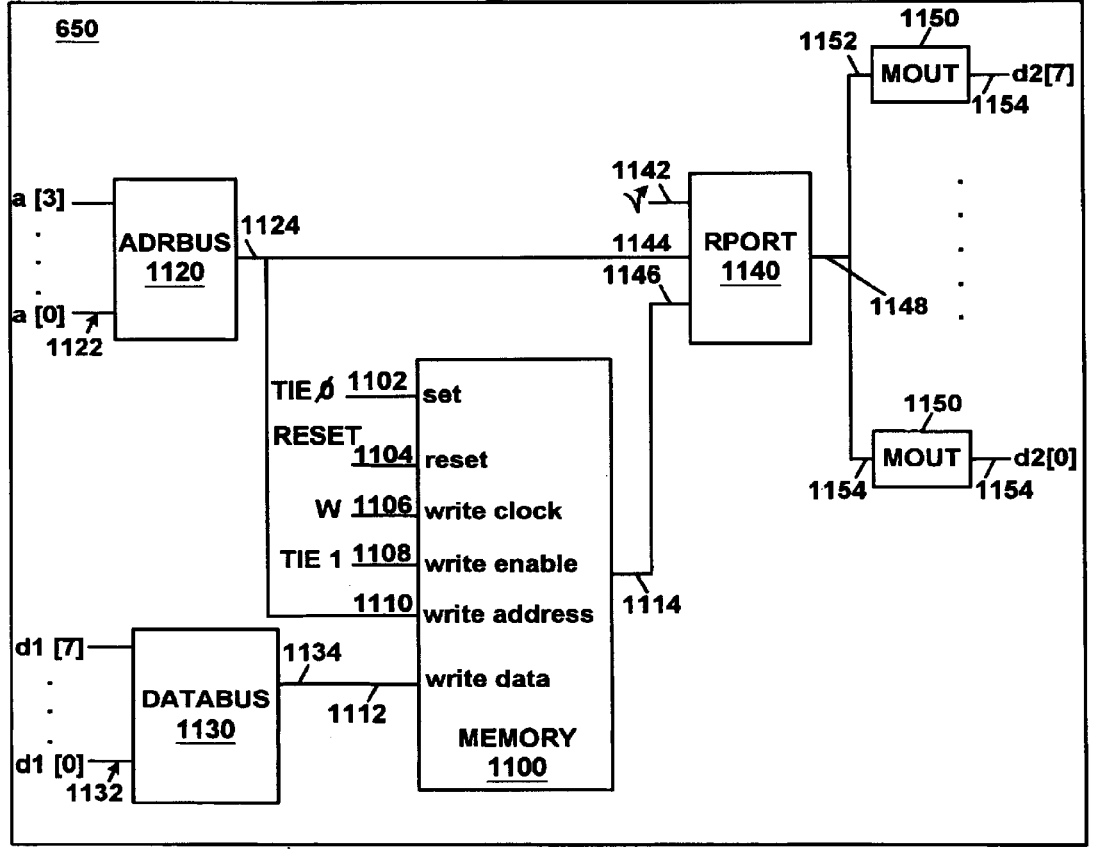
FIG. 6A is a flow diagram illustrating the process of translating an exemplary behavioral model into an ATPG model in accordance with one embodiment of the present invention including a step of automatic ATPG model generation.

FIG. 6A is a flow diagram illustrating the process of translating an exemplary behavioral model 600 into a corresponding ATPG model 650 in accordance with one embodiment of the present invention including a step of automatic ATPG model generation. As illustrated, simplified behavioral description 600 has a reset line, an edge-triggered write port and a level-sensitive read port sharing the same address with the write port. Simplified behavioral description 600 is written with a pre-defined subset of Verilog (e.g., subset 400) that is recognized by ATPG memory model generation process 310. As a result, the simplified description 600 can be read directly using ATPG memory model generation process 310. Further, the simplified behavioral description 600 does not contain timing and layout information, and is less complex than the behavioral description contained in simulation library 301. It should be noted that both the simplified behavioral description 600 and the original simulation model are written in behavioral Verilog. Therefore, checking functional equivalence can be performed easily with a Verilog simulator.

Also illustrated in FIG. 6A is an exemplary ATPG memory model 650 generated from simplified behavioral description 600 by the ATPG memory model generation process 310 according to an embodiment of the present invention. In essence, ATPG memory model 650 represents a structural model of the RAM described by behavioral description 600. As illustrated in FIG. 6A, exemplary ATPG memory model 650 consists of a MEMORY primitive 1100, an ADRBUS primitive 1120, a DATABUS primitive 1130, a RPORT primitive 1140 and a plurality of MOUT primitives 1150. These primitives closely model the functionality of the RAM described by behavioral description 600.

With reference still to FIG. 6A, the inputs 1122 of the ADRBUS primitive 1120 are coupled to address data "a." The inputs 1132 of the DATABUS primitive 1130 are coupled to data "d1," and the outputs 1154 of the MOUT primitives are coupled to data "d2." The set input 1102 of the MEMORY primitive 1100 is tied inactive (TIE0); the write enable input 1108 is tied active (TIE1); and the output 1124 of the ADRBUS primitive 1120 is shared by the write address line 1110 of MEMORY primitive 1100, and read address line 1144 of RPORT primitive 1140. The write clock input 1106 is coupled to a signal "w" and the reset input 1104 is coupled to a signal "reset." The output port 1114 of the MEMORY primitive 1100 is coupled to the read data port 1146 of the RPORT primitive 1140. The read clock input 1142 is coupled to signal "r." The output 1148 of the RPORT primitive is coupled to inputs 1152 of MOUT primitives 1154. Some attributes of the RAM, however, are not shown in the ATPG memory model 650. For instance, for the simplified behavioral description 600, the write port is edge-triggered and the read port is inactive-0. These attributes are coded within the ATPG primitives, but can be displayed on request.

In furtherance of one embodiment of the present invention, the schematic viewer 350 (FIG. 3) may be used to display graphical representations of the ATPG model 650.

Figure 6B:
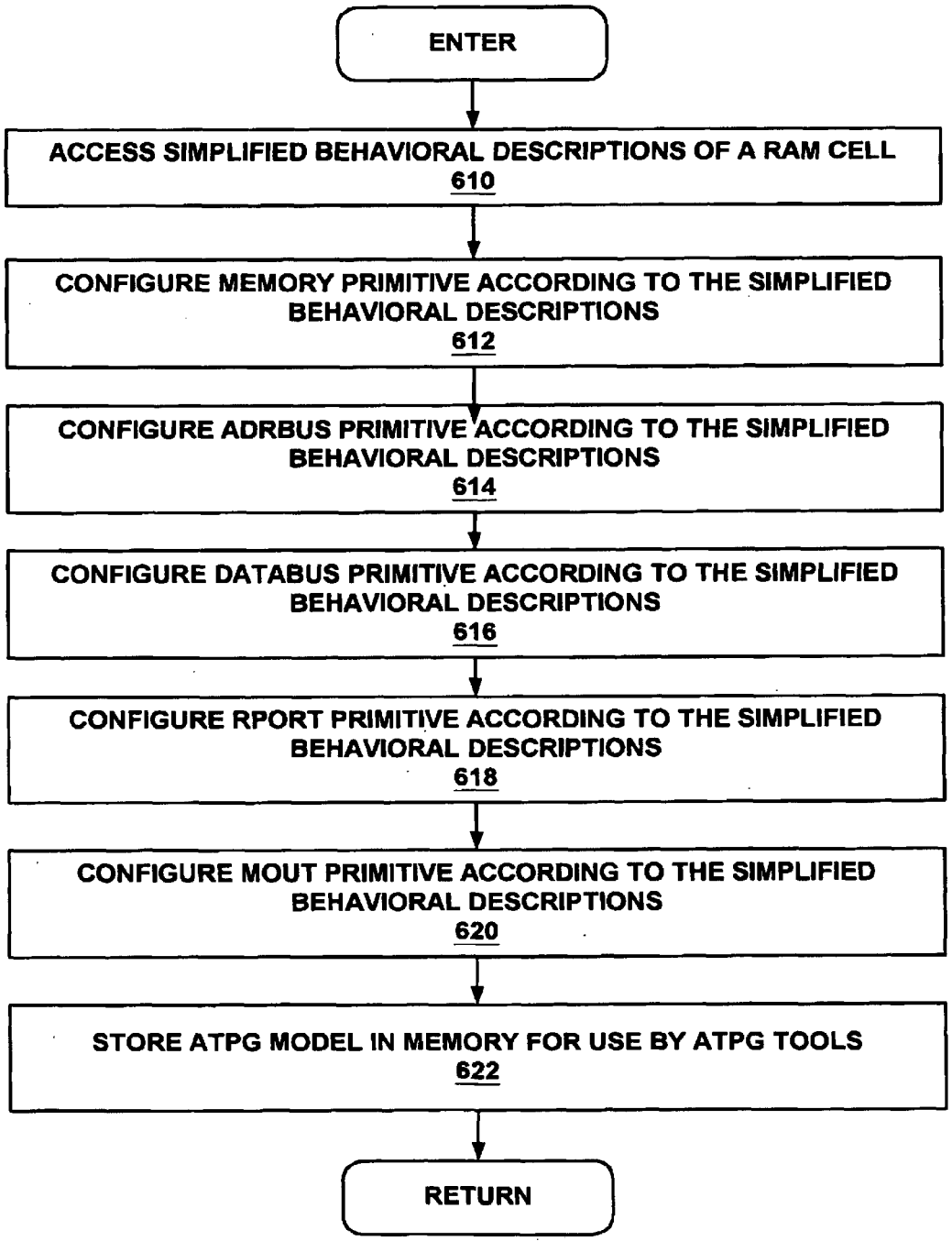
FIG. 6B is a flow diagram illustrating the steps of the automatic ATPG model generation process of FIG. 6A according to an embodiment of the present invention.

FIG. 6B is a flow diagram illustrating the steps of the automatic ATPG model generation process 310 of FIG. 6A according to an embodiment of the present invention. As illustrated, at step 610, the ATPG model generation process 310 accesses a simplified behavioral description 600 of an exemplary RAM. According to the present embodiment, the simplified behavioral description 600 is generated by re-describing the simulation model of the RAM contained in the simulation library 301.

At step 612, based on the behavioral description, the ATPG model generation process 310 configures a MEMORY primitive 1100 for representing the data storage functionality of the RAM. For example, the simplified behavioral description 600 defines the RAM to have a data dimension of 8-bit. Step 612 then automatically configures the MEMORY primitive 1100 to have a data dimension of 8-bit. In addition, the ATPG model generation process 310 ties the set input 1102 to inactive (TIE0) and ties the write_enable input 1108 to active (TIE1), as dictated by the behavioral description 600. ATPG model generation process 310 also couples the reset input 1104 to a signal "reset," and couples the write_clock input 1106 to a signal "w" such that the behavioral description 600 is accurately modeled. Other characteristics of the RAM, such as level/edge sensitivity of its write port, are also stored as attributes of the MEMORY primitive 1100.

At step 614, the ATPG model generation process 310 configures an ADRBUS primitive 1120 for representing the address functionality of the RAM based on the simplified behavioral description 600. As illustrated in FIG. 6A, the simplified behavioral description 600 defines the RAM to have an address dimension of 4-bit. Step 614 automatically configures the ADRBUS primitive 1120 to include 4 inputs 1122 for receiving 4-bit addresses 'a." In addition, ATPG model generation process 310 couples the output 1124 of the ADRBUS primitive 1120 to the write address input 1110 and read address input 1144.

At step 616, the ATPG model generation process 310 configures DATABUS primitive 1130 for representing the databus functionality of the RAM described by the simplified behavioral description 600. As illustrated in FIG. 6A, the simplified behavioral description 600 defines the RAM to have a data dimension of 8-bit. Thus, step 616 configures the DATABUS primitive 1130 to include 8 inputs 1132 for receiving 8-bit data "d1."

At step 618, the ATPG model generation process 310 configures the RPORT primitive 1140 for representing the read port functionality of the RAM described by the simplified behavioral description 600. In the present embodiment, the ATPG memory model generation process 310 couples the output 1114 of the MEMORY primitive 1100 to the read data input 1146 of the RPORT primitive 1140. Further, the ATPG model generation process 310 couples the read clock input 1142 of the RPORT primitive 1140 to the signal "r." Other characteristics of the read port of the RAM described by the behavioral description 600 may also be stored at step 618 as attributes of the RPORT primitive 1140.

At step 620, the ATPG model generation process 310 configures the MOUT primitives 1150 for holding the simulated values of the ATPG model 650. The data dimension of the MEMORY primitive 1100 is defined to be 8-bit. Therefore, ATPG model generation process 310 couples eight MOUT primitives 1150 to the output of the RPORT primitive 1140. The outputs 1154 of the MOUT primitives 1150 represent 8 bit data "d2."

At step 622, after the appropriate ATPG primitives are configured, the ATPG memory model 650 is stored in the memory (e.g., volatile memory 102) of the computer system 112. According to one embodiment of the present invention, the ATPG model 650 is ready to be used for test pattern generation.

Read Data Dependencies

With reference again to FIG. 6A, the behavioral description 600 is acceptable for the ATPG model generation process 310 of the present invention, and results in the unambiguous ATPG model 650. However, behavioral description 600 may be ambiguous to certain Verilog simulators. This problem is primarily caused by two differences between how the ATPG model 650 is simulated and how the event-driven Verilog simulator simulates the behavioral description 600.

First, if the address "a" changes while the read port is active (e.g., r==1), the data read on "d2" will be updated in the ATPG model 650, but not in the Verilog simulation, because the change on "a" is not a simulator event that triggers the "always" cause to be re-evaluated.

Second, the "always" statements are executed in parallel. Thus, if the reset or the write port change the content of the memory, this change may or may not be reflected on the read port, depending on whether the "always" statement of the read port is executed after or before the "always" statement that changes the memory content.

Because of these differences, the ATPG model generation process 310, in one embodiment of the invention, includes Verilog simulator specific rules checking functionalities for catching such ambiguities. The ATPG model generation process 310 of the present embodiment will also warn of these ambiguities with respect to Verilog descriptions of memories such as description 600. The model generation process 310 of the present embodiment can also write out a modified description in which both ambiguities are corrected.

FIG. 12 illustrates an exemplary modified behavioral description 1200 of the same memory described by behavioral description 600 according to one embodiment of the present invention. In the present embodiment, modified behavioral description 1200 is generated by the ATPG model generation process 310 after parsing behavioral description 600. As illustrated in FIG. 12, the address "a" is used in the sensitivity list of the read port's "always" statements. In addition, the event variable "mymem_update" ensures that the read port will be updated after any reset or write.

ATPG Primitives in Accordance with the Present Invention

A description of an exemplary set of ATPG memory primitives in accordance with the present invention follows.

Memory Primitive (MEMORY)

Figure 11A:
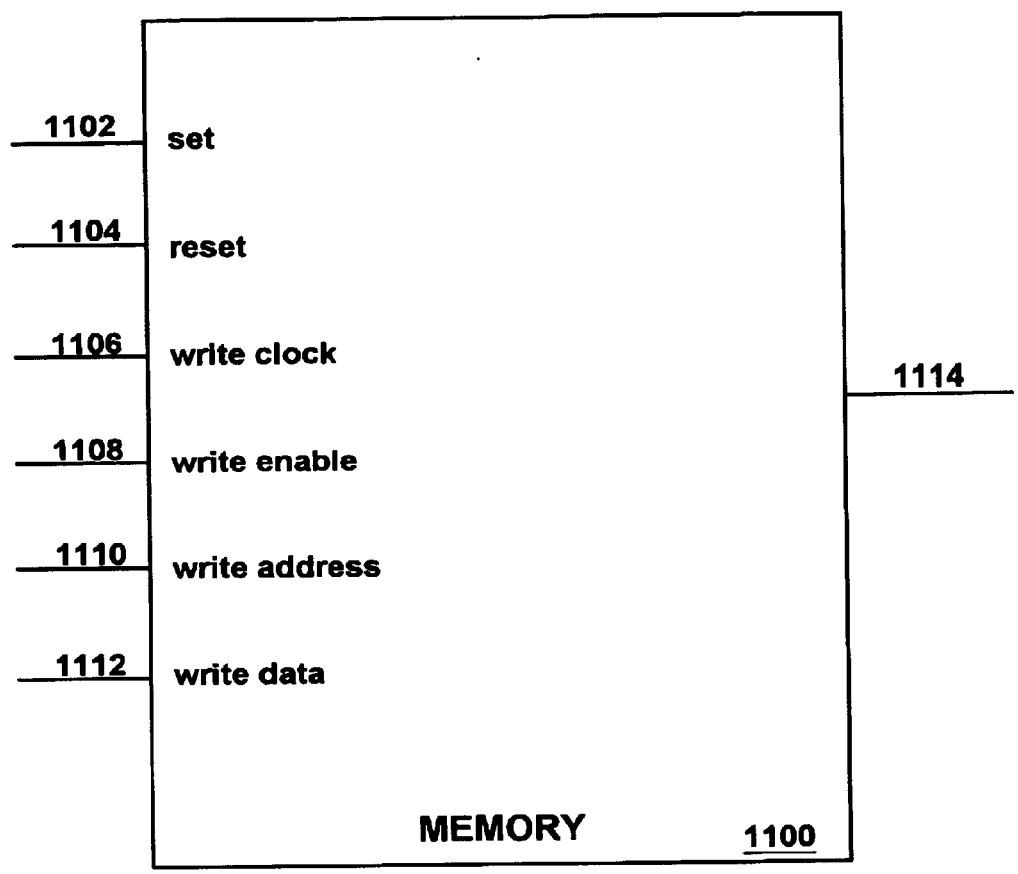
FIG. 11A illustrates a memory primitive (MEMORY) according to one embodiment of the present invention.

FIG. 11A illustrates a memory primitive (MEMORY) 1100 according to one embodiment of the present invention. MEMORY primitive 1100 is used for modeling RAMs and ROMs and for storing all their memory values. In the illustrated embodiment, the MEMORY primitive 1100 has six inputs: set 1102, reset 1104, write_clock 1106, write_enable 1108, write_address 1110 and data 1112. The write_address input 1110 is for connecting to an ADRBUS primitive (described below), and the data input 1112 is for connecting to a DATABUS primitive (described below). The write_clock input 1106 may be either level-sensitive (e.g., active high) or edge-triggered (e.g., active on 0 to 1 edge); the write operation requires an active write input 1106 while the write_enable 1108 is at logic 1. The output 1114 of the MEMORY primitive 1100 is for connecting to RPORT primitives (described below). The behavior of the MEMORY primitive can be modified by several user-definable attributes such as those that control contention behavior when multiple read-write ports are active at the same time. These user-definable attributes are described below. In another embodiment, for modeling ROMs, MEMORY primitive 1100 may have no input. In yet another embodiment, MEMORY primitive 1100 may have only two inputs: set 1102 and reset 1104.

Address Bus Primitive (ADRBUS)

Figure 11B:
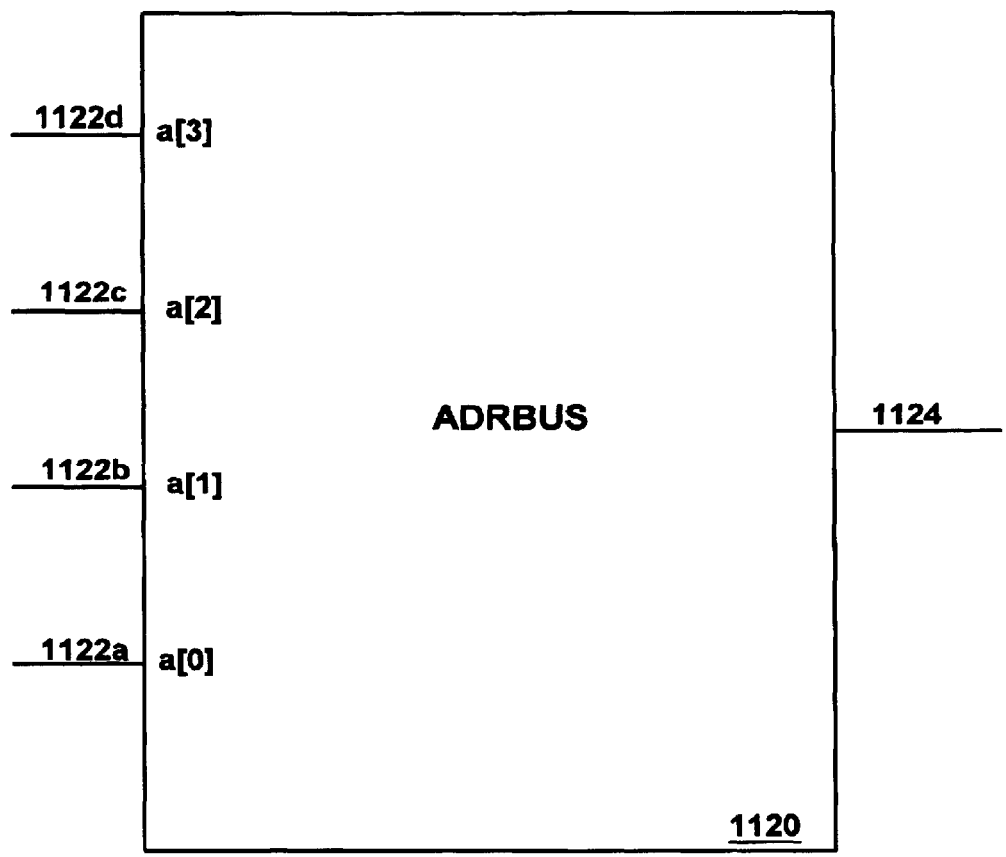
FIG. 11B illustrates an address bus primitive (ADRBUS) according to one embodiment of the present invention.

FIG. 11B illustrates an address bus primitive (ADRBUS) 1120 according to one embodiment of the present invention. According to the present invention, the ADRBUS primitive 1120 is used for calculating address values for MEMORY primitive 1100 and RPORT primitives (described below). In the illustrated embodiment, the exemplary ADRBUS primitive 1120 has four inputs 1122a–1122d for receiving a four-bit address. It should be appreciated that the number of inputs of the ADRBUS primitive 1120 is exemplary and should match the address dimension of the connecting MEMORY primitive 1100. The ADRBUS primitive 1120 has an output 1124 for connecting to MEMORY primitive 1100 and RPORT primitives (described below). In one embodiment, the ADRBUS primitive 1120 has an attribute that indicates whether the incoming address is encoded (n bits) or decoded ($2^n$ bits). In the present embodiment, a valid decoded address has exactly one bit "on" and all others "off."

Data Bus Primitive (DATABUS)

Figure 11C:
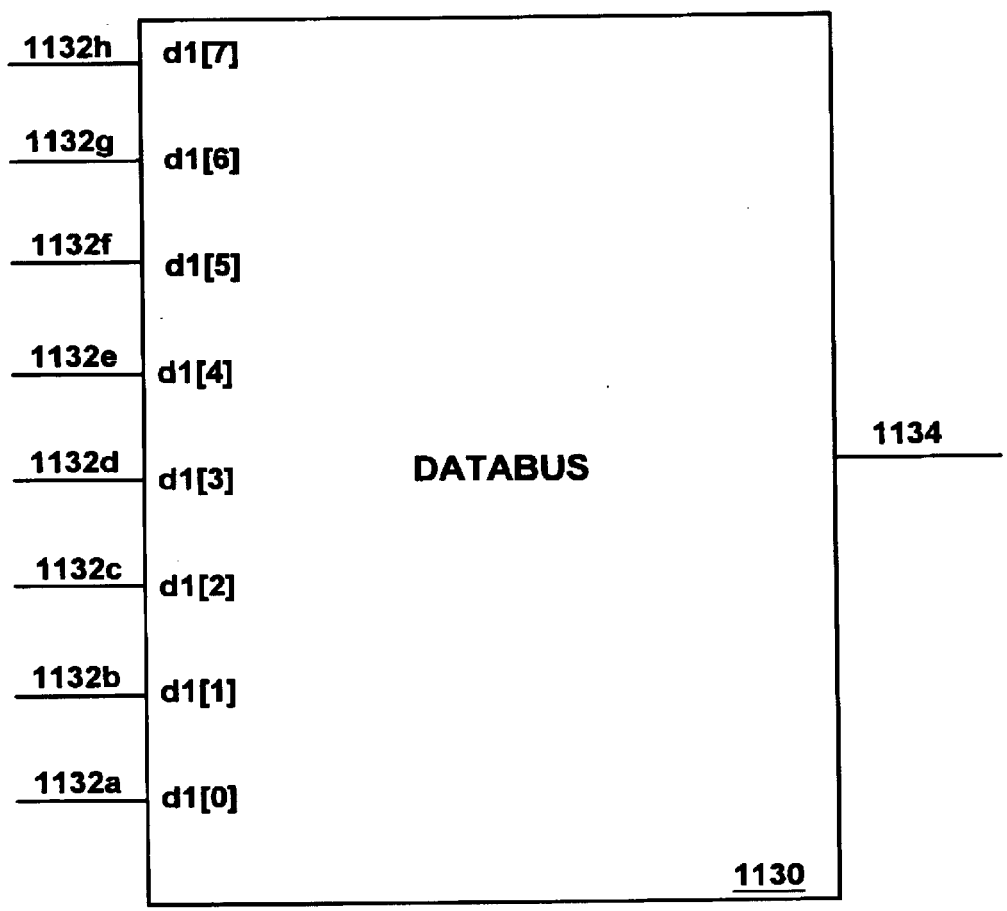
FIG. 11C illustrates an data bus primitive (DATABUS) in accordance with one embodiment of the present invention.

FIG. 11C illustrates a data bus primitive (DATABUS) 1130 in accordance with one embodiment of the present invention. In furtherance of the present invention, the DATABUS primitive 1130 has eight inputs and is used for determining data values for MEMORY primitives (e.g., MEMORY primitive 1100). The output 1134 of the DATABUS primitive 1130 is for connecting to a MEMORY primitive 1100. The number of inputs 1132a–1132h is variable and should match the data dimension of the connected MEMORY primitives.

Read Port Primitive (RPORT)

Figure 11D:
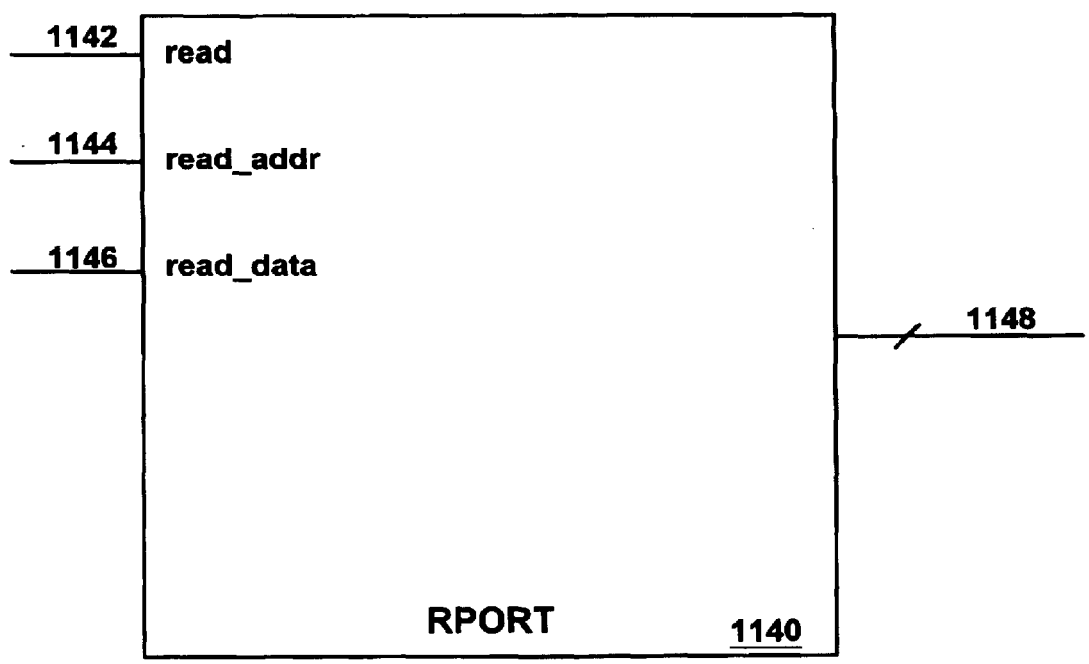
FIG. 11D illustrates a read port primitive (RPORT) according to an embodiment of the present invention.

FIG. 11D illustrates a read port primitive (RPORT) 1140 according to an embodiment of the present invention. As illustrated, RPORT primitive 1140 has three inputs: the first is the active high read line 1142, the second is the address line 1144 (which is for connecting to an ADRBUS primitive), and the third is the data line 1146 (which is for connecting to a MEMORY U primitive 1100). The RPORT primitive 1140 is a multiple-output primitive. The outputs 1148 of the RPORT primitive 1140 are for connecting to MOUT primitives (described below) which is for holding the simulated values. In the present embodiment, the number of outputs 1148 of the RPORT primitive 1140 is variable and should match the data dimension of the connecting MEMORY primitive 1100.

Macro Output Primitive (MOUT)

Figure 11E:
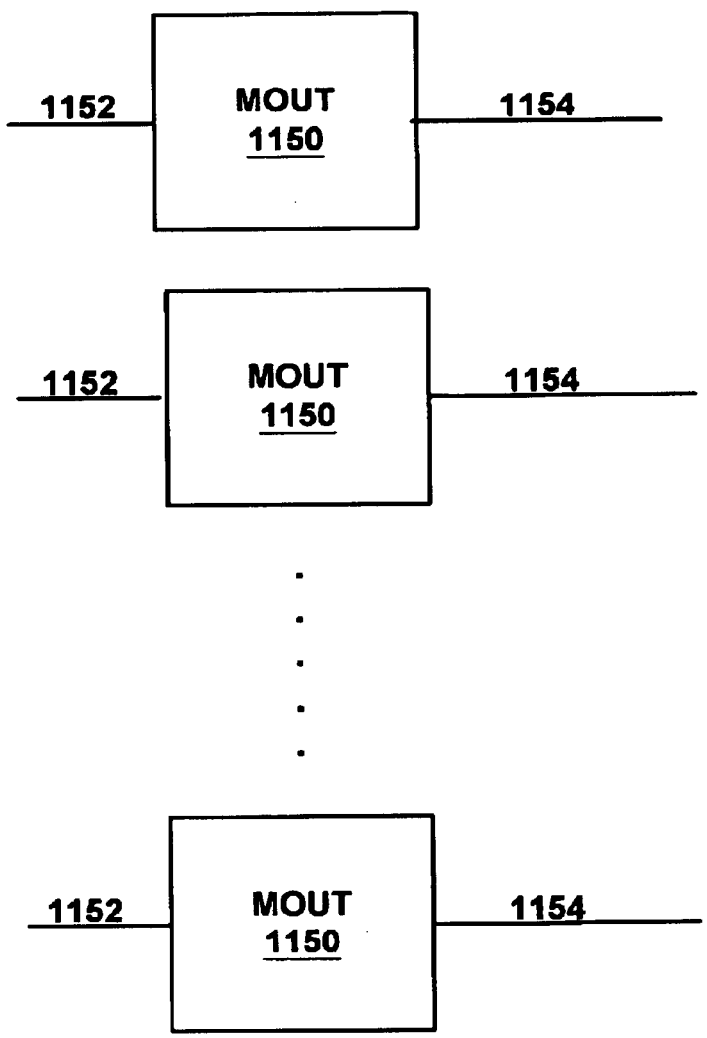
FIG. 11E illustrates a plurality of macro output primitives (MOUT) according to one embodiment of the present invention.

FIG. 11E illustrates a plurality of MOUT primitives 1150 according to one embodiment of the present invention. Each one of the MOUT primitives 1150 has one input 1152 and one output 1154. Each MOUT primitive 1150 represents an output bit of the primitive connected to its input 1152. MOUT primitives 1150 used for modeling multiple output macros (such as RAMs and ROMs).

Write Port Attributes

As illustrated in the formal description 400 of FIG. 4, the write clock triggers the evaluation of the "always @" statements, whereas the write enable qualifies the "if" statement. The level/edge sensitivity of the write clock and the write enable is coded as an attribute of the MEMORY primitive 1100. These attributes are not illustrated in the schematic representation of the ATPG model 650 of FIG. 6A. However, these attributes can be inspected on request.

Read Port Attributes

Similar to write ports, read ports of an ATPG memory model also support independent read clocks (e.g., "always @" statements) and optional read enables (e.g., "if" statements). Additionally, read-off behavior of the read ports is also defined using the "else" statement in the simplified behavioral description 600. However, the RPORT primitive 1140 is always combinational: ATPG rules checking and test generation, as well as the displaying the ATPG memory model would be complicated if state elements other than DLAT primitives, DFF primitives and MEMORY primitives (e.g., primitive 1100) are added. Therefore, read-off behavior sometimes requires additional gates to model. Various implementations of the read port attributes in accordance with the present invention follows.

a. Read-off 0, 1 and X Attribute for Read Port

According to one embodiment of the present invention, setting all data lines to 0, 1 or X when the read is inactive is a combinational event directly supported by the RPORT primitive 1140 and MEMORY primitive 1100. A Verilog example of a read-off-0 port is shown in the simplified behavioral description 600 and the schematic representation of the corresponding ATPG memory model 650 of FIG. 6A. Read ports with offstates 0, 1 and X cannot be mixed in the same memory model, as the read-off value is supplied by the MEMORY primitive 1100. This leads to a simpler implementation. In the unlikely case that a read-off-0 port is to be added to an ATPG memory model that already has a read-off 1 port, additional AND gates must be added on the read output bus to force all data read lines to 0.

b. Read-off Z Attribute for Read Port

Figure 7A:
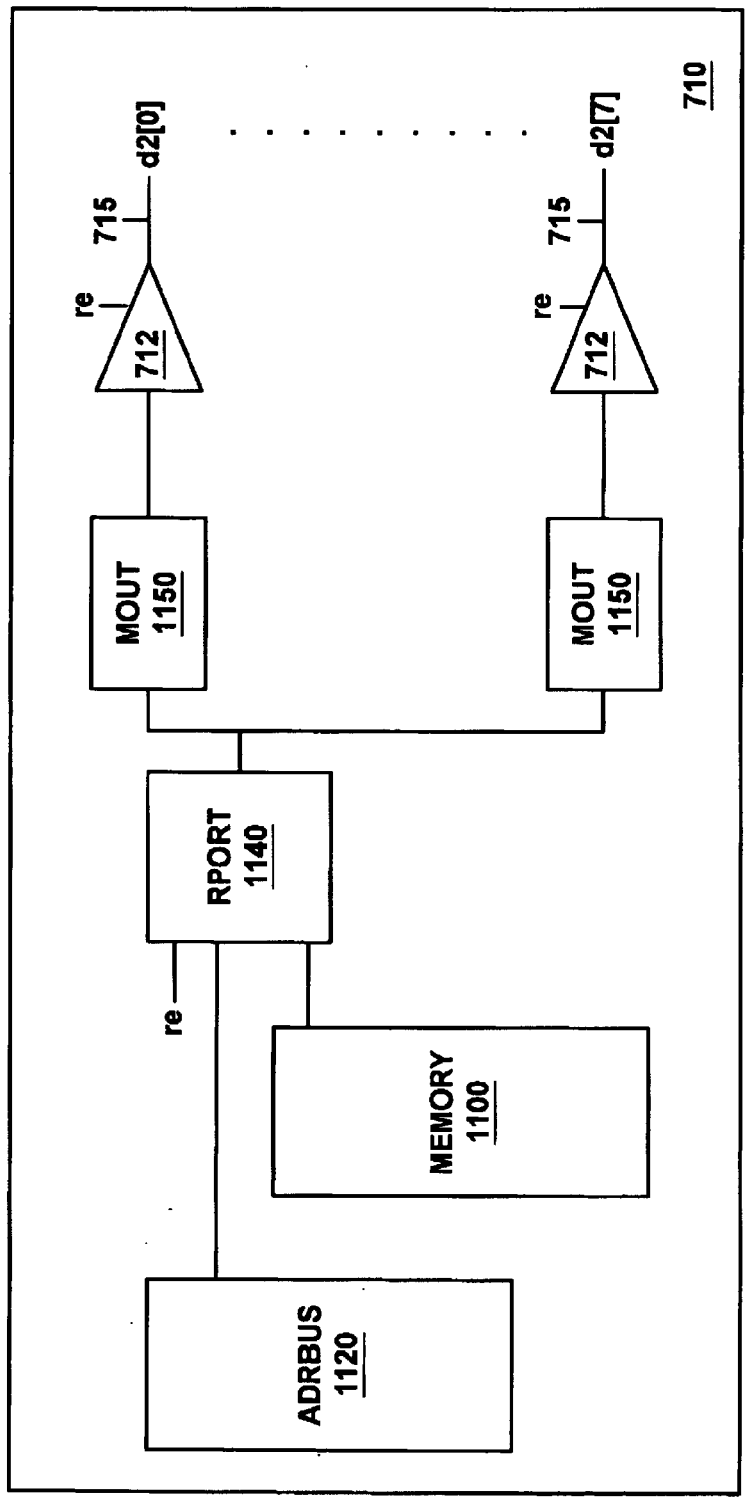
FIG. 7A illustrates primitives of an ATPG model that has the read-off Z attribute in accordance with the present invention.

Read-off Z is common for read ports of memories designed to share common read lines. Having multiple memories drive the same net results in BUS gates, which require additional bus-contention rules checking and special handling for test generation. Thus, it is important that the read-off Z behavior be implemented explicitly in the ATPG memory model. FIG. 7A illustrates portions of an exemplary ATPG memory model 710 that implements the read-off-Z attribute using tri-state drivers 712. In the present embodiment, when disabled (e.g., read enable "re" is at logic-0), the tri-state drivers 712 output Z on all data lines 715. The behavioral description of a read port having the read-off-Z attribute is shown in Table 1. According to the present embodiment, when process 310 encounters the syntax of Table 1, it generates the ATPG model 710 as shown in FIG. 7A. It should be appreciated that graphical representation of the exemplary model 710 may be displayed to the users by the schematic viewer 350 of the present invention via display unit 105 of computer system 112.

TABLE 1 always @ r if (re) de2 = mymem[a];
else d2 = 8'dZ;

c. Read-off Keep Attribute for Read Port

Figure 7B:
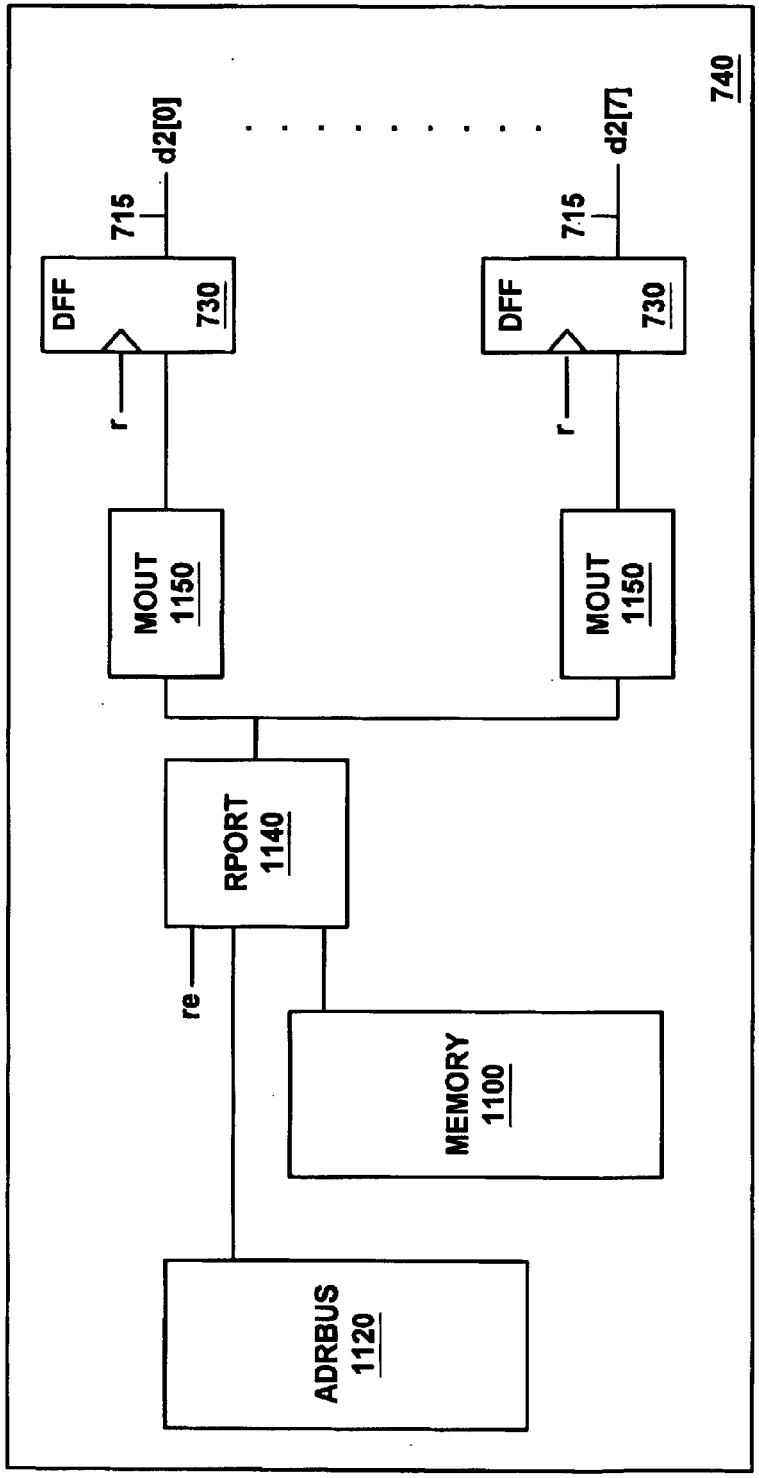
FIG. 7B illustrates primitives of an ATPG model that includes DFF primitives according to an embodiment of the present invention.

Behavioral HDL simulators (such as Verilog simulators) are event-triggered, thus if the Verilog read port description has no "else" part then the values on the read data lines remain unchanged until the next read operation. In the ATPG memory model, this corresponds to a sequential behavior and is modeled by adding DLAT or DFF gates on the read data lines. FIG. 7B illustrates portions of an exemplary an ATPG memory model 740 that includes DFF primitives 730 for latching the values of the read data lines 715. In the illustrated embodiment, the read data lines 715 are edge triggered. Thus, DFF primitives 730 are used. In another embodiment where read data lines are level-sensitive, DLAT primitives (not shown) may be used. The behavioral description of an exemplary read port that has no "else" part is illustrated in Table 2. It should be appreciated that, when process 310 encounters the syntax of Table 2, it generates the ATPG model 740 of FIG. 7B. It should be appreciated that graphical representation of the exemplary model 740 may be displayed to the users by the schematic viewer 350 of one embodiment of the present invention via display unit 105 of computer system 112.

Figure 7C:
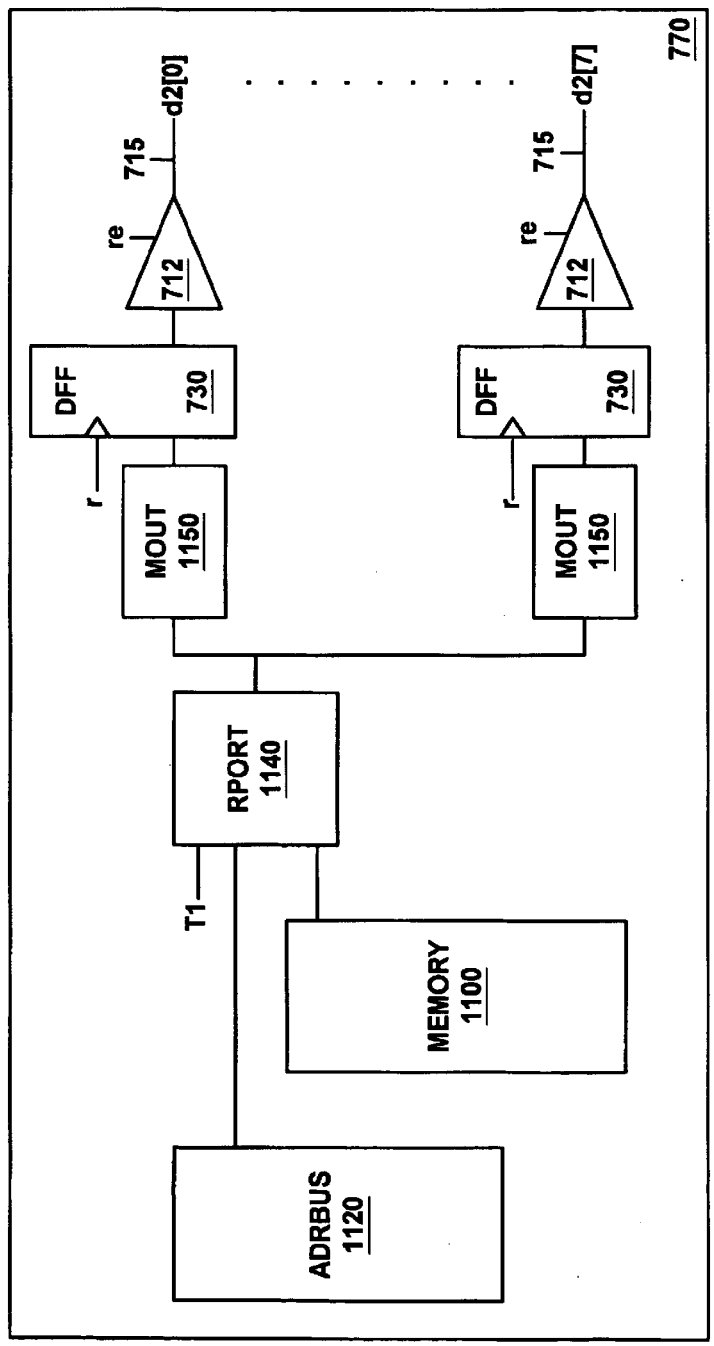
FIG. 7C illustrates primitives of an ATPG model having an edge-triggered read port with read-off Z according to an embodiment of the present invention.
Figure 10:
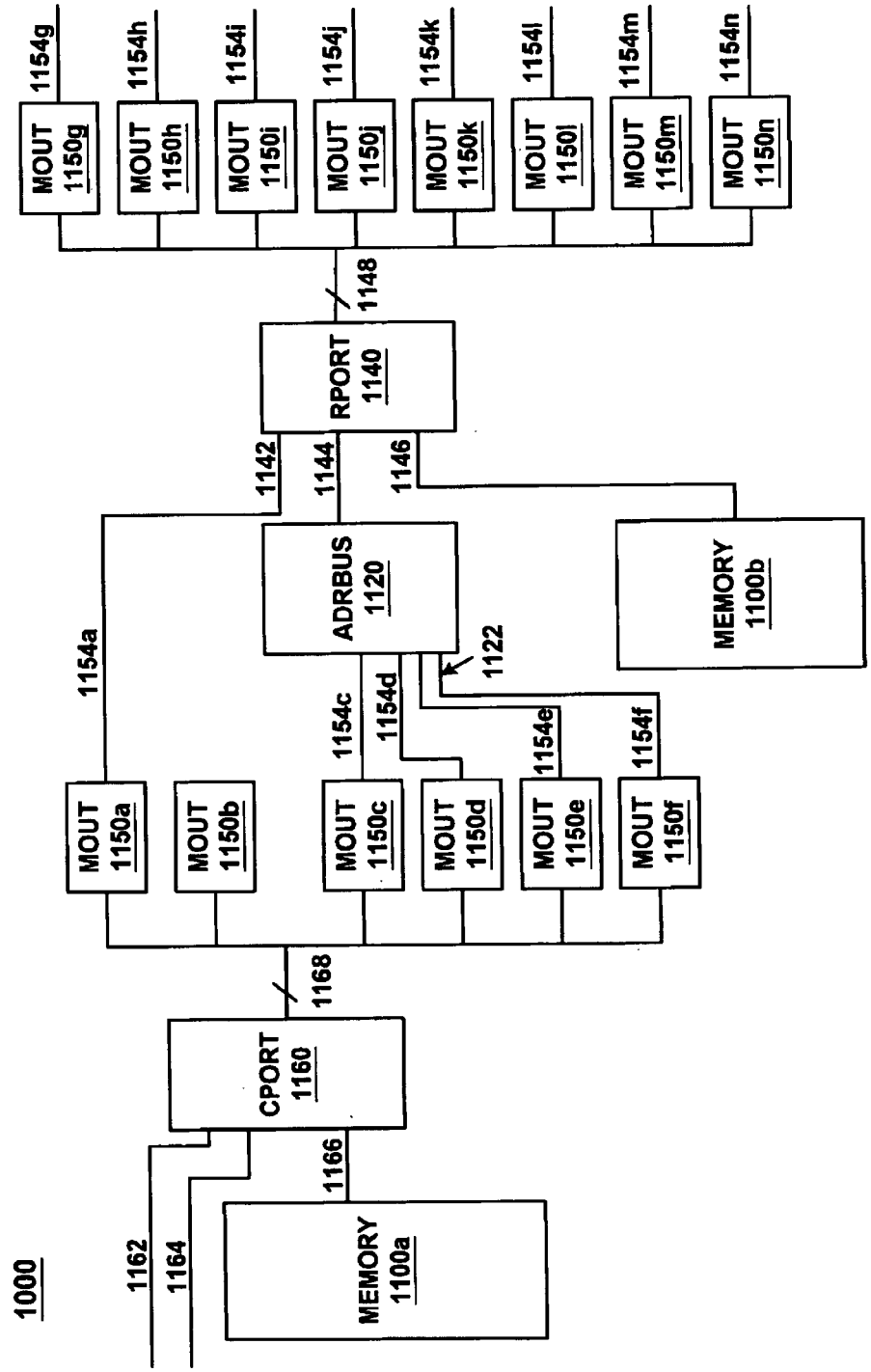
FIG. 10 illustrates an ATPG model for an exemplary CAM-RAM according to an embodiment of the present invention.

TABLE 2 always @ (posedge r)
    if (re) d2 = mymem[a];

Edge-triggered read may be combined with read-off 0, 1, X or Z, in which case both a DFF primitive 730 and another gate must be added on the read data lines 715. FIG. 7C illustrates portions of an exemplary ATPG memory model 770 having an edge-triggered read port with read-off Z. As illustrated, the RPORT primitive 1140 is always active, whereas the DFF primitive 730 and the tri-state drivers 712 are controlled by r and re respectively. The behavioral description of an exemplary read port that is edge-trigged and has a read-off Z attribute is illustrated in Table 3. According to the present embodiment, when process 310 encounters the syntax of Table 3, it generates the ATPG model as illustrated in FIG. 7C. It should be noted that graphical representation of the ATPG model 770 may be displayed to the users by the schematic viewer 350 (FIG. 3) of one embodiment of the present invention via display unit 105 of computer system 112.

TABLE 3 always @ (posedge r)
    if (re) d2 = mymem[a];
    else d2 = 8'bZ;

Same-Address Contention

When multiple read and/or write ports are active and their addresses are the same, different contention behaviors may result. In the present embodiment, the ATPG memory model is not changed to show contention behavior. Instead, special attributes are set on the MEMORY primitive 1100 to capture contention behavior. These attributes do not have a schematic representation, but can be inspected by the user. The behavioral Verilog modeling of all but the most trivial contention behavior would require nested "if"—"else" constructs and would add significant complexity as the read/write ports would no longer be separated. Instead, Verilog'define constructs can be used to define contention behavior for the ATPG memory model generation process (Table 4). These constructs are ignored by Verilog simulators, thus memory models with non-default contention behavior will be simulated differently by Verilog simulators and the ATPG tool. Nonetheless, this difference is limited to the corner case when multiple ports with the same address are active at the same time and do not justify the significant extra model complexity that would be required to exactly match the two simulators.

TABLE 4

| Contention Type | | Verilog Encoding for ATPG |
|---|---|---|
| read—read | normal read | 'define read__read normal |
|  | all ports read X | 'define read__read X |
| read-write | read new data | 'define read__write new |
|  | read- read X | 'define read__write X |
|  | read X and write X | 'define read__write Xfill |
| write—write | a port dominates others | 'define write__write dominance |
|  | X-out contention bits | 'define write__write Xbit |
|  | X-out contention words | 'define write__write Xword |
|  | X-out entire MEMORY | 'define write__write Xfill |

Decoded Addresses

Designers often separate the address decoding function from the memory macro, thus creating memories that receive a decoded address. The present invention is also capable of efficiently modeling decoded-address memories.

Because Verilog does not support the concept of decoded addresses and because it is desirable to have an ATPG memory model that is compatible with Verilog simulators, an explicit encoding function is defined for decoded read or write ports. FIG. 8 illustrates a behavioral description 800 of a RAM that includes such an explicit encoding function. As illustrated, the function addr_encode converts a 128 bit decoded address into a 7-bit encoded address. In the present embodiment, the syntax of the read and write ports is identical to encoded-address read or write ports, except for the test for non-zero address and the call of the addr_encode function.

In the present embodiment, the ATPG memory model for decoded address ports are identical to those for encoded addresses, except that the ADRBUS primitive 1120 will have 128 inputs instead of 7. A special attribute on the ADRBUS primitive 1120 indicates whether a decoded or encoded address is input. In one implementation, this attribute is not shown in the schematic representation of the structural models, but can be inspected on demand. This consistent representation of encoded and decoded addresses allows memory models to have any mix of encoded and decoded ports.

Behavioral Modeling of Content Addressable
Memories in Accordance with the Present Invention Content-addressable memories (CAMs) are common in high-performance designs. However, existing ATPG tools provide no or only clumsy features to model CAMs. As with RAMS, a CAM model should be flexible enough to model most CAMs in a simple manner, yet the ATPG model built must be very efficient. Yet, CAM modeling is even more challenging than RAM modeling because of the inherent complexity and variety of CAM designs. In the present embodiment, CAMs are modeled in a similar fashion the RAMs are modeled. CAM models, however, include a CPORT primitive for matching data from a data bus primitive to the content of a memory primitive.

Compare Port Primitive (CPORT)

Figure 11F:
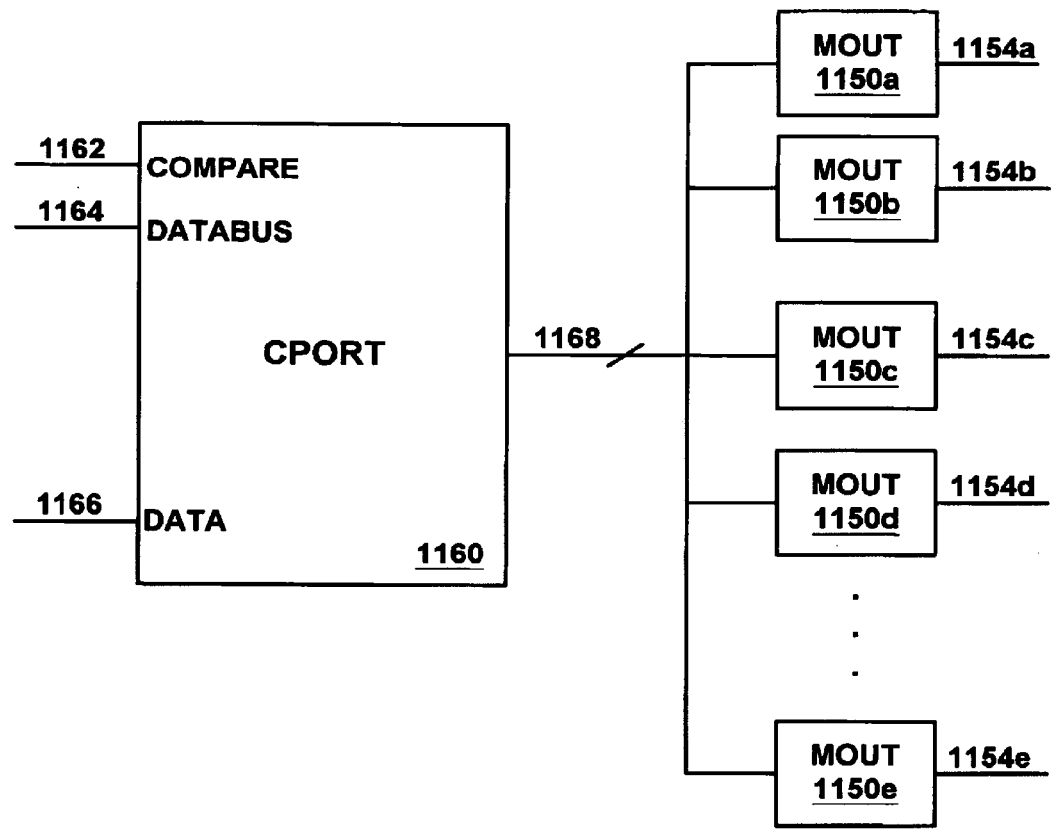
FIG. 11F illustrates a compare port primitive (CPORT) and a plurality of macro output primitives according to the present invention.

FIG. 11F illustrates a compare port primitive (CPORT) 1160 and a plurality of MOUT primitives 1150a–1150e according to the present invention. As illustrated, the CPORT primitive 1160 has three inputs: the first input is the active high compare line 1162, the second input is the databus line 1164 (which is for connecting to a DATABUS primitive), and the third input is the data line 1166 (which is for connecting to a MEMORY primitive 1100). In another embodiment, compare line 1162 may be inverted. An optional fourth input (not shown) for connecting to a second DATABUS primitive may provide a compare mask.

The CPORT primitive 1160 is physically a multiple-output primitive. The output connections 1168 are for connecting to MOUT primitives 1150a–1150e which represent and hold the simulated values generated by the CPORT primitive 1160. In the embodiment of the present invention, a first MOUT primitive 1150a holds a MATCH output, and another MOUT primitive 1150b holds a MULTIPLE-MATCH output. Other MOUT primitives 1150c–1150e hold the (encoded or decoded) address line values.

According to the present invention, CPORT primitive 1160 is for matching data from databus line 1164 to the content of MEMORY primitive 1100a and for generating a MATCH signal and the address of the matching location when a match occurs. In addition, CPORT primitive 1160 is for generating a MULTIPLE-MATCH signal when multiple matches occur. In operation, if the compare line 1162 is at logic-0 (inactive), the MATCH output (output 1154a of MOUT primitive 1150a) is set to 0 and the outputs 1150b–1150e of MOUT primitives 1150b–1150e are set to X. When the compare line 1162 is at logic-1 (active), and if there is no address in the MEMORY primitive 1100 that is coupled to data line 1166 whose data is identical to the databus input 1164, the MATCH and MULTIPLE-MATCH signals (outputs 1154a–1154b of MOUT primitives 1150a–1150b) are set to 0 and the outputs 1154c–1154e of MOUT primitives 1150c–1150e are set to X. If the compare line 1162 is active and there is a memory location in the MEMORY primitive 1100 whose data matches the databus input 1164, (optionally masked with the second DATABUS input), the MATCH output (output 1154a) will be set to 1 and the outputs 1154c–1154e of MOUT primitives 1150c–1150e are set to the address of the matching location.

In case of multiple matches, the output of MOUT primitive 1150b is also set to logic-1 and the matching address can be selected to be one of: X (no valid address, this is the default), the first matching address or last matching address.

A simplified behavioral description 900 of a simple CAM according to the present invention shown in FIG. 9A. Similar to RAMs, behavioral descriptions of CAMs must first be simplified before the ATPG model generation process (e.g., process 310) of the present invention can automatically generate ATPG memory models. It should be noted that the CAM described by behavioral description 900 returns the last matching address if multiple matches occur. Further, the CAM has 8-bit data and 4-bit encoded address.

A simplified behavioral description 940 of a more complex CAM is shown in FIG. 9B. Compared to the CAM model 900 of FIG. 9A, a mask input has been added to FIG. 9B. Also, the first (rather than last) matching address is returned.

FIG. 9C shows a simplified behavioral description 970 of a CAM that a returns a decoded (rather than encoded) address. Unlike the behavioral descriptions 900 and 940 of FIG. 9A and FIG. 9B, the CAM port described in FIG. 9C returns no match when multiple matches occur.

A CAM-RAM Example According to the Present Invention

A typical application of CAMs is generating the address input for a RAM. This configuration, generally know as a CAM-RAM configuration, is represented in the ATPG memory model by coupling the outputs 1168 of the CPORT primitive 1160 to the inputs of the RPORT primitive 1140. FIG. 1Q illustrates a schematic representation of an ATPG model 1000 for an exemplary CAM-RAM. Memories 1100a and 1100b typically have one or more write ports, comprised of ADRBUS and DATABUS primitives, not showed.

As illustrated, ATPG model 1000 includes MEMORY primitives 1100a–1100b, CPORT primitive 1160, RPORT primitive 1140, ADRBUS primitive 1120 and MOUT primitives 1150a–1150n. The first MEMORY primitive 1100a is coupled to the CPORT primitive 1160 via data line 1166. CPORT primitive 1160 receives a compare signal via line 1162 and receives data from a DATABUS primitive via line 1164. CPORT primitive 1160 is also coupled to MOUT primitives 1150a–1150f via output lines 1168. CPORT primitive 1160 is for matching data from line 1164 to the content of MEMORY primitive 1100a and for generating a MATCH signal and the address of the matching location when a match occurs. Inputs 1122 of ADRBUS primitive 1120 are coupled to MOUT primitives 1150c–1150f for receiving addresses. The second MEMORY primitive 1100b is coupled to RPORT primitive 1140 via memory data line 1146. RPORT primitive 1140 receives addresses from ADR-BUS primitive 1120 via address line 1144. Outputs 1148 of RPORT primitive 1140 are coupled to MOUT primitives 1150g–1150n.

In operation, if the compare line 1162 is at logic-0 (inactive), the output 1154a of MOUT primitive 1150a (MATCH signal) is set to 0 and the outputs 1154c–1154f of MOUT primitives 1150b–1150f are set to X. When the compare line 1162 is at logic-1 (active), and if there is no address in the MEMORY primitive 1100a whose data is identical to the databus input 1164, the output 1154a (MATCH signal) is set to 0 and the outputs 1154c–1154f of MOUT primitives 1150c–1150f are set to X. If the compare line 1162 is active and there is a memory location in the MEMORY primitive 1100a whose data matches the databus input 1164, the output 1154a is set to 1 and the outputs 1154c–1154f of the MOUT primitives 1150c–1150f are set to the address of the matching location.

The output 1154a (MATCH signal) of the MOUT primitive 1150a is coupled to the read line 1142 of the RPORT primitive 1140. The outputs 1154c–1154f of the MOUT primitives 1150c–1150f are coupled to the ADRBUS primitive 1120. Thus, when a MATCH occurs, the outputs 1154c–1154f of the MOUT primitives 1150c–1150f, which are set to the address of the matching location, will be provided to the read address line 1144 of the RPORT primitive 1140. The outputs 1154g–1154h of MOUT primitives 1150g–1150n will then be set to the data contained in the MEMORY primitive 1100b at the address of the matching location.

It should be noted that the CPORT primitive 1160 and the RPORT primitive 1140 allow CAM-RAM modeling with no memory-to-memory connection. This significantly reduces the complexity of modeling CAM-RAMs. It should be appreciated that other combinations are also possible. For example, the outputs of the CPORT primitive 1160 could control a write port of a MEMORY primitive 1100. Any combination of RPORT primitives 1140 and CPORT primitives 1160 can be connected to a MEMORY primitive 1100. Any number of write ports, as well as any number of compare ports, can be added to both the CAM and the RAM.

The preferred embodiment of the present invention, a system and method for generating ATPG models of memories from behavioral descriptions, is thus described. While the present invention has been described in particular embodiments, it should be appreciated that the present invention should not be construed as limited by such embodiments, but rather construed according to the below claims.

What is claimed is:

1. A memory model usable for computer simulation and automatic test pattern generation, the memory model comprising:

a memory primitive comprising a write_address port, a write_data port, and an output port;

a read data port primitive comprising a read_data port for coupling to the output port of the memory primitive, a read_address port, and an output port;

an address bus primitive comprising an output port for coupling to the write_address port of the memory primitive and the read_address port of the read data port primitive;

a data bus primitive comprising an output port for coupling to the write_data port of the memory primitive; and a plurality of memory out primitives, each memory out primitive comprising an input port for coupling to the output port of the read data port primitive.

2. The memory model of claim 1, wherein the memory primitive further includes:
   a set input port;
   a reset port;
   a write_clock port; and
   a write_enable port.

3. The memory model of claim 1, wherein the read data port primitive represents a read port functionality of the memory.

4. The memory model of claim 1, wherein a dimension of the output port of the read data port corresponds to a data dimension of the memory primitive.

5. The memory model of claim 1, wherein the address bus primitive represents an address functionality of a memory.

6. The memory model of claim 5, wherein the address bus primitive includes:
   a plurality of input ports corresponding to an address dimension of the memory primitive.

7. The memory model of claim 6, wherein the address bus primitive further includes an attribute indicating whether an incoming address is encoded or decoded.

8. The memory model of claim 7, wherein the data bus primitive represents a data bus functionality of the memory.

9. The memory model of claim 8, wherein the data bus includes:
   a plurality of input ports corresponding to a data dimension of the memory primitive.

10. The memory model of claim 1, wherein each memory out primitive represents a simulated value storage functionality of the memory.

11. The memory model of claim 1, wherein each memory out primitive includes an output port.

12. The memory model of claim 11, wherein a plurality of tristate drivers can be coupled to the output ports of the memory out primitives, thereby representing an attribute of the read data port primitive.

13. The memory model of claim 11, wherein a plurality of edge-triggered registers can be coupled to the output ports of the memory out primitives, thereby representing an attribute of the read data port primitive.

14. The memory model of claim 13, wherein input ports of a plurality of tristate drivers can be coupled to output ports of the plurality of edge-triggered registers, thereby representing an attribute of the read data port primitive.

15. A content addressable memory model usable for computer simulation and automatic test pattern generation, the content addressable memory model comprising:
   a memory primitive including an output port;
   a compare port primitive including a data port for coupling to the output port of the memory primitive, a data bus port, and an output port;
   a data bus primitive including an output port for coupling to the data bus port of the compare port primitive;
   a plurality of memory output primitives, each memory output primitive including an input port for coupling to the output port of the compare port primitive and an output port; and
   an address bus primitive including input ports for coupling the output ports of a set of the memory output primitives.

16. The content addressable memory model of claim 15, wherein the compare port primitive further includes:
   a compare enable port for receiving a compare signal.

17. A combined content addressable memory (CAM) and random access memory (RAM) model usable for computer simulation and automatic test pattern generation, the combined CAM and RAM model comprising:
   a first memory primitive including an output port;
   a data bus primitive including an output port;
   a compare port primitive for coupling to the memory primitive and the data bus primitive, the compare port primitive comprising;
   a compare enable port;
   a data bus port for coupling to the output port of the data bus primitive;
   a data port for coupling to the output port of the first memory primitive; and
   an output port;
   a first plurality of memory output primitives, each memory output primitive including an output port and an input port for coupling to the output port of the compare port primitive;
   an address bus primitive including an output port and input ports for coupling to output ports of a first subset of the first plurality of memory output primitives;
   a second memory primitive including an output port;
   a read data port primitive including a first input port for coupling to the output port of the second memory primitive, a second input port for coupling to an output port of the address bus primitive, and a third input port for coupling to the output ports of a second subset of the plurality of memory output primitives; and
   a second plurality of memory output primitives, each memory output primitive including an input port for coupling to an output port of the read data port primitive.

* * * * *

UNITED STATES PATENT AND TRADEMARK OFFICE
CERTIFICATE OF CORRECTION

PATENT NO. : 6,959,272 B2
APPLICATION NO. : 09/360069
DATED : October 25, 2005
INVENTOR(S) : Peter Wohl et al.

It is certified that error appears in the above-identified patent and that said Letters Patent is hereby corrected as shown below:

<u>Column 17,</u>
Line 11, replace "claim 1" with -- claim 3 --.

Signed and Sealed this

Twenty-seventh Day of June, 2006

JON W. DUDAS
*Director of the United States Patent and Trademark Office*